(12) United States Patent
Sugiyama et al.

(10) Patent No.: US 7,652,913 B2
(45) Date of Patent: Jan. 26, 2010

(54) MAGNETORESISTANCE EFFECT ELEMENT AND MAGNETIC MEMORY

(75) Inventors: Hideyuki Sugiyama, Yokohama (JP); Yoshiaki Saito, Kawasaki (JP); Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 11/608,969

(22) Filed: Dec. 11, 2006

(65) Prior Publication Data
US 2007/0177421 A1    Aug. 2, 2007

(30) Foreign Application Priority Data
Jan. 31, 2006    (JP) .............................. 2006-023337

(51) Int. Cl.
   *G11C 11/00*    (2006.01)
(52) U.S. Cl. ..................... 365/158; 365/171; 365/225.5; 977/933; 977/935
(58) Field of Classification Search ................ 365/171, 365/173, 158, 131, 66, 80–85, 100, 148, 365/225.5, 243.5; 257/421, E21.665; 438/3; 977/933, 934, 935
See application file for complete search history.

(56) References Cited

U.S. PATENT DOCUMENTS 6,256,223 B1    7/2001    Sun
6,888,742 B1    5/2005    Nguyen et al.

FOREIGN PATENT DOCUMENTS

JP    2003-218430    7/2003
JP    2005-109263    4/2005

OTHER PUBLICATIONS

"Recent Developments in Magnetic Tunnel Junction MRAM," by S. Tehrani et al., IEEE Transactions on Magnetics, vol. 36, No. 5, Sep. 2000.*
"Magnetization configuration and switching behavior of submicron NiFe elements: Pac-man shape," by M. H. Park et al., Appl. Phys. Lett., vol. 83, No. 2, Jul. 14, 2003.*
U.S. Appl. No. 11/846,040, filed Aug. 28, 2007, Inokuchi, et al.

* cited by examiner

*Primary Examiner*—Richard Elms
*Assistant Examiner*—Harry W Byrne
(74) *Attorney, Agent, or Firm*—Oblon, Spivak, McClelland, Maier & Neustadt, L.L.P.

(57) ABSTRACT

It is made possible to cause spin inversion at a low current density which does not cause element destruction and to conduct writing with a small current. A magnetoresistance effect element includes: a magnetization pinned layer in which magnetization direction is pinned; a magnetic recording layer in which magnetization direction is changeable, the magnetization direction in the magnetization pinned layer forming an angle which is greater than 0 degree and less than 180 degrees with a magnetization direction in the magnetic recording layer, and the magnetization direction in the magnetic recording layer being inverted by injecting spin-polarized electrons into the magnetic recording layer; and a nonmagnetic metal layer provided between the magnetization pinned layer and the magnetic recording layer.

10 Claims, 12 Drawing Sheets

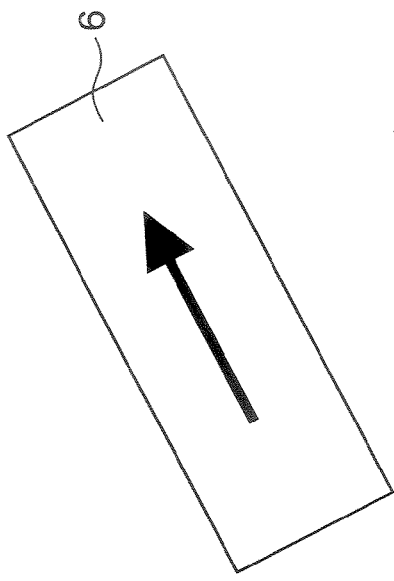
FIG. 3A MAGNETIZATION DIRECTION IN MAGNETIC RECORDING LAYER 6
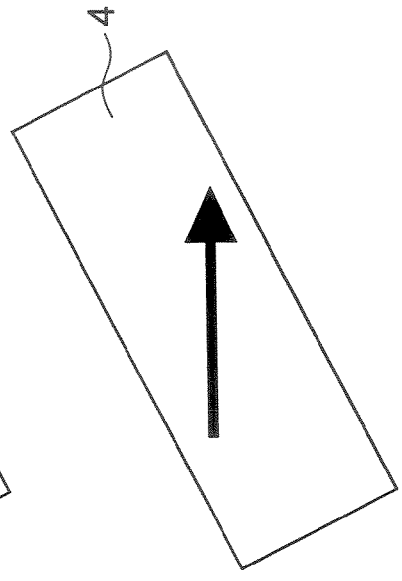
FIG. 3B MAGNETIZATION DIRECTION IN MAGNETIZATION PINNED LAYER 4
FIG. 3C θ (ANGLE FORMED BY MAGNETIZATION DIRECTION IN MAGNETIZATION PINNED LAYER 4 WITH MAGNETIZATION DIRECTION IN MAGNETIC RECORDING LAYER 6)

MAGNETIZATION DIRECTION IN MAGNETIZATION PINNED LAYER

MAGNETIZATION DIRECTION IN MAGNETIZATION PINNED LAYER

MAGNETIZATION DIRECTION IN MAGNETIZATION PINNED LAYER

| FILM SURFACE SHAPE | AREA | AVERAGE INVERSION CURRENT DENSITY |
|---|---|---|
| NEARLY RECTANGULAR | $2.0 \times 10^4 nm^2$ | $1.2 \times 10^6 A/cm^2$ |
| NEARLY ELLIPTIC | $1.6 \times 10^4 nm^2$ | $1.4 \times 10^6 A/cm^2$ |
| NEARLY PARALLELOGRAMMATIC | $2.0 \times 10^4 nm^2$ | $1.3 \times 10^6 A/cm^2$ |

| FILM SURFACE SHAPE | AREA | AVERAGE INVERSION CURRENT DENSITY |
|---|---|---|
| NEARLY RECTANGULAR | $2.0 \times 10^4 nm^2$ | $1.2 \times 10^6 A/cm^2$ |
| NEARLY ELLIPTIC | $1.6 \times 10^4 nm^2$ | $1.1 \times 10^6 A/cm^2$ |
| NEARLY PARALLELOGRAMMATIC | $2.0 \times 10^4 nm^2$ | $1.1 \times 10^6 A/cm^2$ |

| SHAPE OF FIRST PORTION | SHAPE OF SECOND PORTION | AREA | AVERAGE INVERSION CURRENT DENSITY |
|---|---|---|---|
| NEARLY RECTANGULAR | NEARLY RECTANGULAR | $3.0 \times 10^4 \text{nm}^2$ | $2.7 \times 10^6 \text{ A/cm}^2$ |
| NEARLY ELLIPTIC | NEARLY ELLIPTIC | $2.4 \times 10^4 \text{nm}^2$ | $2.4 \times 10^6 \text{ A/cm}^2$ |
| NEARLY PARALLEL-OGRAMMATIC | NEARLY PARALLEL-OGRAMMATIC | $3.0 \times 10^4 \text{nm}^2$ | $2.2 \times 10^6 \text{ A/cm}^2$ |

FIG. 17

| SHAPE | ANGLE $\phi$ | WHETHER ANNEAL IS PRESENT | AREA | AVERAGE INVERSION CURRENT DENSITY |
|---|---|---|---|---|
| SQUARE | 30° | PRESENT | $1.0 \times 10^4 \text{nm}^2$ | $1.2 \times 10^6 \text{ A/cm}^2$ |
| SQUARE | 30° | ABSENT | $1.0 \times 10^4 \text{nm}^2$ | $1.3 \times 10^6 \text{ A/cm}^2$ |
| CIRCLE | 5° | PRESENT | $0.79 \times 10^4 \text{nm}^2$ | $3.8 \times 10^6 \text{ A/cm}^2$ |
| CIRCLE | 10° | PRESENT | $0.79 \times 10^4 \text{nm}^2$ | $2.2 \times 10^6 \text{ A/cm}^2$ |
| CIRCLE | 30° | PRESENT | $0.79 \times 10^4 \text{nm}^2$ | $1.1 \times 10^6 \text{ A/cm}^2$ |
| CIRCLE | 5° | ABSENT | $0.79 \times 10^4 \text{nm}^2$ | $3.6 \times 10^6 \text{ A/cm}^2$ |
| CIRCLE | 10° | ABSENT | $0.79 \times 10^4 \text{nm}^2$ | $2.1 \times 10^6 \text{ A/cm}^2$ |
| CIRCLE | 30° | ABSENT | $0.79 \times 10^4 \text{nm}^2$ | $1.2 \times 10^6 \text{ A/cm}^2$ |

FIG. 18

MAGNETORESISTANCE EFFECT ELEMENT AND MAGNETIC MEMORY

CROSS-REFERENCE TO RELATED APPLICATION

This application is based upon and claims the benefit of priority from prior Japanese Patent Application No. 2006-23337 filed on Jan. 31, 2006 in Japan, the entire contents of which are incorporated herein by reference.

BACKGROUND OF THE INVENTION

1. Field of the Invention

The present invention relates to a magnetoresistance effect element and a magnetic memory.

2. Related Art

Magnetoresistance effect elements using magnetic material films are used in, for example, magnetic heads and magnetic sensors. In addition, it is proposed to use the magnetoresistance effect elements in solid state MRAMs (Magnetic Random Access Memories).

As a magnetoresistance effect transistor element which has a sandwich structure film formed by inserting a single layer of a dielectric between two ferromagnetic layers, which causes a current to flow perpendicularly to the film surface, and utilizes a tunnel current, the so-called "ferromagnetic TMR (Tunneling Magneto-Resistance effect) element" is proposed. Since it has become possible to obtain a magnetoresistance change rate of at least 20% in the ferromagnetic tunneling magneto-resistance effect element, technical development for commercial application of the element to the MRAM is being conducted vigorously.

This TMR element can be implemented by forming a thin Al (aluminum) layer having a thickness in the range of 0.6 nm to 2.0 nm on a ferromagnetic electrode, then exposing a surface of the Al layer to oxygen glow discharge or oxygen gas, and thereby forming a tunnel barrier layer made of $AL_2O_3$ or a tunnel barrier layer formed as a thin film having a thickness in the range of 0.5 nm to 3.0 nm made of MgO (magnesium oxide).

A ferromagnetic single tunnel junction having a structure obtained by providing one of the ferromagnetic layers having the tunnel barrier layer therebetween with an antiferromagnetic layer and using the ferromagnetic layer as a magnetization pinned layer is proposed.

Furthermore, a magnetic tunnel junction having magnetic particles dispersed in a dielectric, and a ferromagnetic double tunnel junction (continuous film) are also proposed.

These magnetoresistance effect elements also have a possibility of being applied to the MRAMs because it has become possible to obtain a high magnetoresistance change rate and the decrease of the magnetoresistance change rate is suppressed even if the voltage value applied to the magnetic tunnel junction is increased to obtain a desired output voltage value.

The magnetic recording element using the ferromagnetic single tunnel junction or the ferromagnetic double tunnel junction is non-volatile, and has a potential that a write and read time is as fast as 10 nanoseconds or less and the number of times of rewriting is also at least $10^{15}$.

As regards the cell size of the memory, however, there is a problem that the size cannot be made smaller than a semiconductor DRAM (Dynamic Random Access Memory) or less when using an architecture in which a memory cell is formed of one transistor and one TMR element.

In order to solve this problem, a diode type architecture including a series connection composed of a cell formed of a TMR element and a diode between a bit line and a word line and a simple matrix type architecture obtained by arranging cells each having a TMR element between a bit line and a word line are proposed.

In either case, however, there are the following problems. Inversion is conducted using a current magnetic field based on a current pulse when writing to the magnetic recording layer is executed, resulting in high power consumption. When the capacity is increased, there is a limit in allowable current density for wiring and consequently a large capacity cannot be obtained. The area of the driver for letting a current flow increases.

In order to solve the above-described problem, a solid-state magnetic memory having a thin film formed of a high permeability magnetic material around writing wiring is proposed. According to these magnetic memories, a high permeability magnetic film is provided around wiring, and consequently a current value required to write information into the magnetic recording layer can be reduced efficiently. Even if they are used, however, it is very difficult to cause the write current value to become 1 mA or less.

In order to solve these problems, a write method using a spin injection method is proposed (see, for example, U.S. Pat. No. 6,256,223). This write method utilizes inversion of magnetization of the magnetic recording layer in the magnetoresistance effect element obtained by injecting a spin-polarized current into the magnetoresistance effect element.

When conducting spin injection by using the writing method utilizing spin injection, spin inversion does not occur unless a current having a very high current density is let flow to the element. If a current having a high current density is let flow to a magnetoresistance effect element having a tunnel barrier layer, a high electric field is applied to the tunnel barrier layer and consequently element destruction is caused. Therefore, a structure in which spin injection is conducted at a low current density is demanded.

In addition, it is also needed that the spin inversion current density is low to reduce the write current.

As heretofore described, the spin injection method involving operation conducted at a low write current requires an element in which spin inversion is conducted at a low current density.

SUMMARY OF THE INVENTION

The present invention has been made in view of these circumstances, and an object of the present invention is to provide a magnetoresistance effect element in which spin inversion is caused at a low current density which does not cause element destruction and writing can be conducted with a small current, and a magnetic memory using such a magnetoresistance effect element.

A magnetoresistance effect element according to a first aspect of the present invention includes: a magnetization pinned layer in which magnetization direction is pinned; a magnetic recording layer in which magnetization direction is changeable, the magnetization direction in the magnetization pinned layer forming an angle which is greater than 0 degree and less than 180 degrees with a magnetization direction in the magnetic recording layer, and the magnetization direction in the magnetic recording layer being inverted by injecting spin-polarized electrons into the magnetic recording layer; and a non-magnetic metal layer provided between the magnetization pinned layer and the magnetic recording layer.

A magnetic memory according to a second aspect of the present invention includes: a first wiring; a second wiring which crosses the first wiring; and a memory cell including the magnetoresistance effect element according to claim 1, the magnetic recording layer in the magnetoresistance effect element being electrically connected to the first wiring, and the magnetization pinned layer in the magnetoresistance effect element being electrically connected to the second wiring.

BRIEF DESCRIPTION OF THE DRAWINGS

FIGS. 3A to 3C are diagrams for explaining magnetization directions in a magnetic recording layer and a magnetization pinned layer of a magnetoresistance effect element according to the first embodiment;

FIG. 17 is a diagram showing a film surface shape, a film surface area, and an average inverted current density of a magnetoresistance effect element according to the third example; and FIG. 18 is a diagram showing a film surface shape, an inclination angle, whether anneal is present, a film surface area, and an average inverted current density of a magnetoresistance effect element according to a fourth example.

DETAILED DESCRIPTION OF THE INVENTION

Hereafter, embodiments of the present invention will be described with reference to the drawings.

First Embodiment

Figure 1:
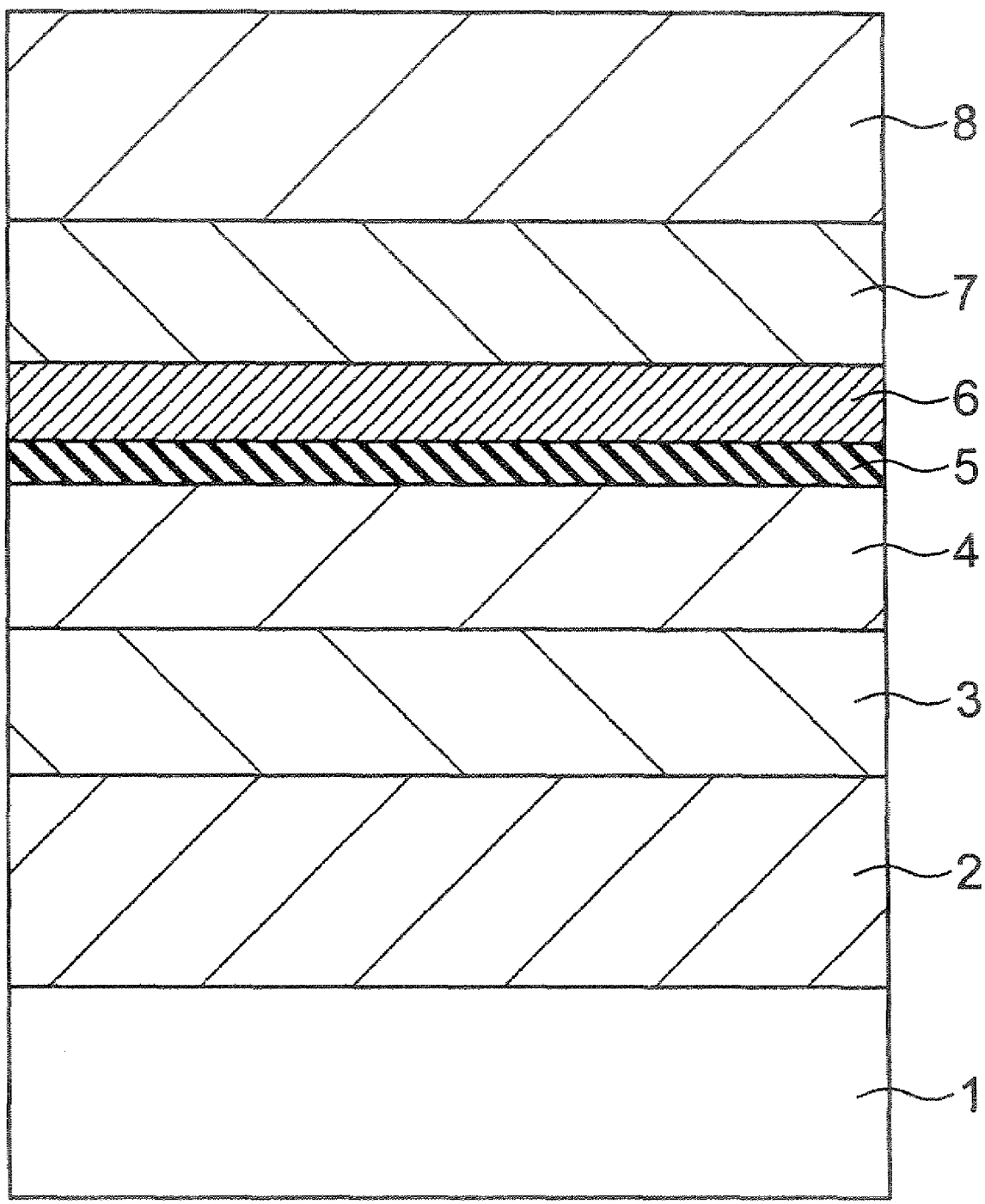
FIG. 1 is a sectional view showing a magnetoresistive effort element according to a first embodiment of the present invention.

A structure of a magnetoresistance effect element according to a first embodiment of the present invention is shown in FIG. 1. FIG. 1 is a sectional view showing a structure of a magnetoresistive effort element according to the present invention. The magnetoresistance effect element according to this embodiment is a bottom-pin TMR element. As shown in FIG. 1, the magnetoresistance effect element has a structure obtained by successively forming a lower electrode 2, an antiferromagnetic layer 3, a magnetization pinned layer 4 pinned in magnetization direction, a tunnel barrier layer 5, a magnetic recording layer 6 having a variable direction of magnetization, a spin reflection layer 7 which reflects spin-polarized electrons, and a counter electrode 8 over a substrate 1. By the way, it is also possible to use a top-pin TMR element shown in FIG. 2 having a layer arrangement between the lower electrode 2 and the counter electrode 8 obtained by reversing the layer arrangement shown in FIG. 1. In other words, it is also possible to use a structure obtained by successively forming the lower electrode 2, the spin reflection layer 7, the magnetic recording layer 6, the tunnel barrier layer 5, the magnetization pinned layer 4, the antiferromagnetic layer 3 and the counter electrode 8 over the substrate 1. If the current density of magnetization inversion caused by spin injection is sufficiently low, the spin reflection layer 7 may be deleted.

Figure 4A:
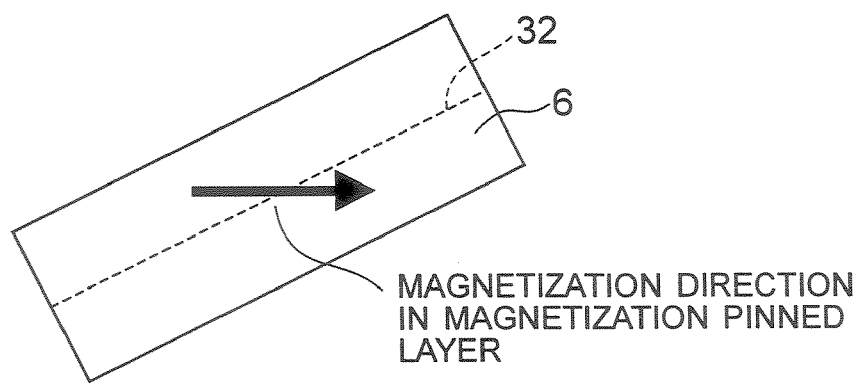
FIGS. 4A to 4C are diagrams for explaining a film surface shape of the magnetoresistance effect element according to the first embodiment.
Figure 4B:
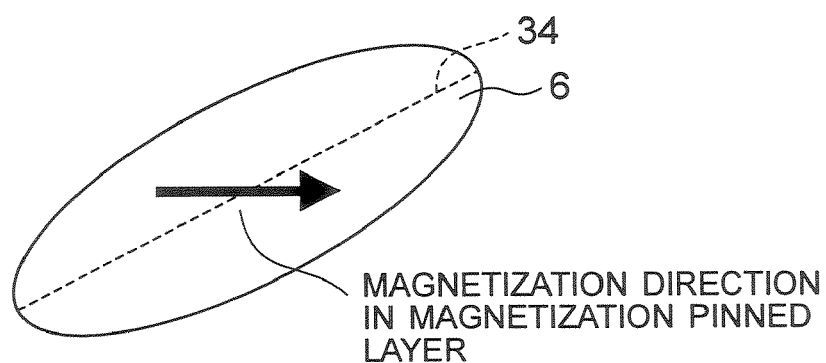
Figure 4C:
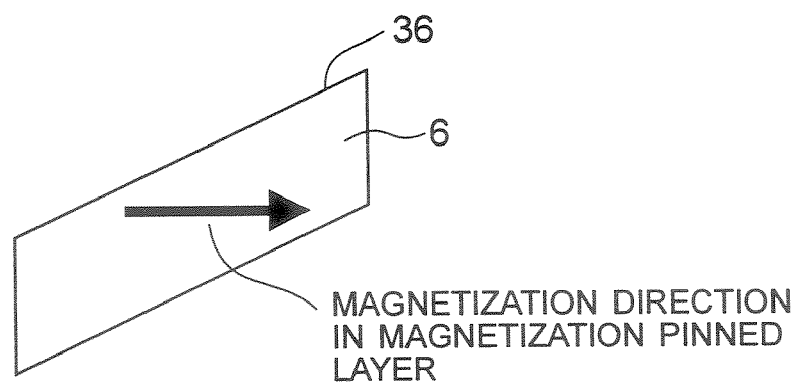
Figure 5A:
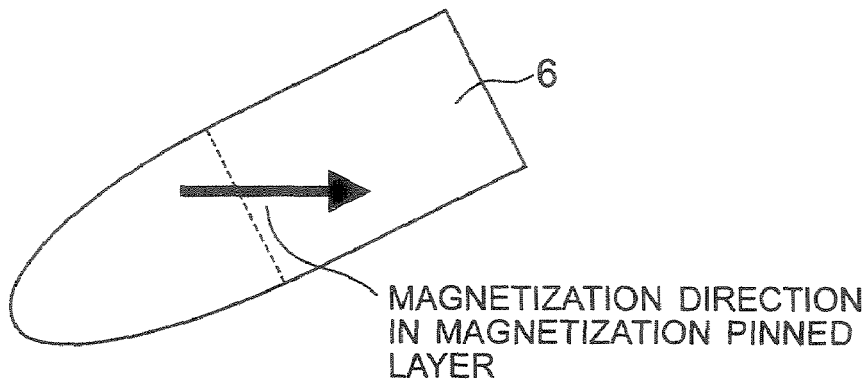
FIGS. 5A to 5C are diagrams for explaining a film surface shape of the magnetoresistance effect element according to the first embodiment.
Figure 5B:
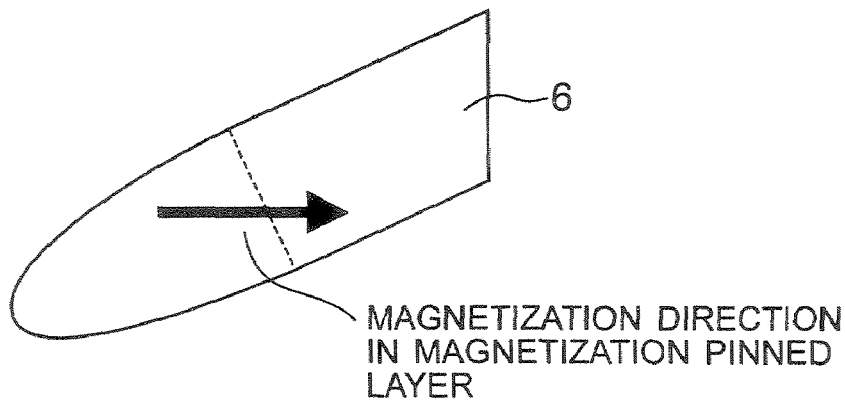
Figure 5C:
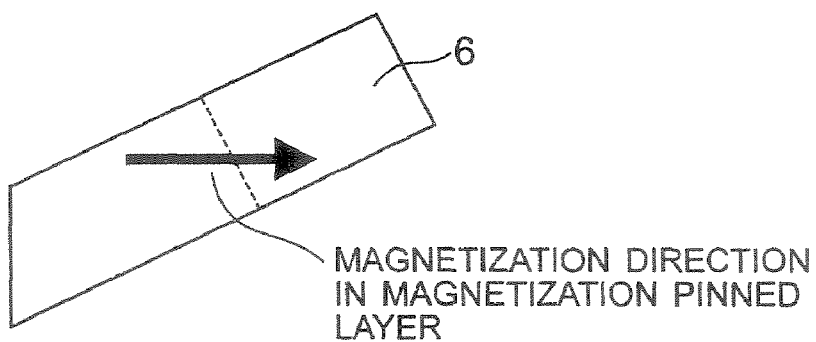

FIGS. 3A and 3B are plan views showing states obtained by seeing the magnetization directions in the magnetization pinned layer 4 and the magnetic recording layer 6 from the counter electrode 8 side shown in FIG. 1. In the present embodiment, the magnetic recording layer 6 has a film surface which substantially takes the shape of a rectangle as shown in FIG. 4A. The magnetic recording layer 6 is magnetized in a direction parallel to the major axis 32 of the rectangle due to the shape anisotropy. The magnetic recording layer 6 can have the shape anisotropy as long as the shape is long and narrow. The film surface of the magnetic recording layer 6 may take the shape of not only the nearly rectangular shape as shown in FIG. 4A, but also an elliptical shape as shown in FIG. 4B or a parallelogrammatic shape as shown in FIG. 4C. The magnetic recording layer 6 is magnetized in a direction parallel to the major axis 34 of the elliptical shape due to the shape anisotropy. The magnetic recording layer 6 is magnetized in a direction parallel to the longer side 36 of the parallelogram due to the shape anisotropy. In addition, the film surface of the magnetic recording layer 4 may take a shape obtained by combining a division of the nearly elliptic shape and a division of the nearly rectangular shape as shown in FIG. 5A, a shape obtained by combining a division of the nearly elliptic shape and a division of the nearly parallelogrammatic shape as shown in FIG. 5B, or a shape obtained by combining a division of the nearly parallelogrammatic shape and a division of the nearly rectangular shape as shown in FIG. 5C. Furthermore, the magnetization direction in the magnetization pinned layer 4 and the magnetization direction in the magnetic recording layer 6 in the present embodiment has a certain angle θ between. In other words, the angle θ is not 0 degree, and the angle θ is not 180 degrees.

In general, supposing that the angle formed by the magnetization direction in the magnetization pinned layer 4 with the magnetization direction in the magnetic recording layer 6 is θ, the injection efficiency of the polarized spin electrons depends upon the angle θ and a spin polarization factor P of the magnetic recording layer 6. As described in, for example, "Journal of Magnetism and Magnetic Materials, 159 (1996) L1," the injection efficiency of spin electrons is represented by the following equation.

$$g(\theta)=[-4+(1+P)^3(3+\cos\theta)/4P^{3/2}]^{-1}$$

Letting $$\alpha=\{(P^{1/2}+P^{-1/2})^3\}/4 \text{ and}$$

$$\beta=-4+3\alpha,$$

$g(\theta)$ can be represented as $$g(\theta)=(\beta-\alpha\cos\theta)^{-1}$$

Figure 6:
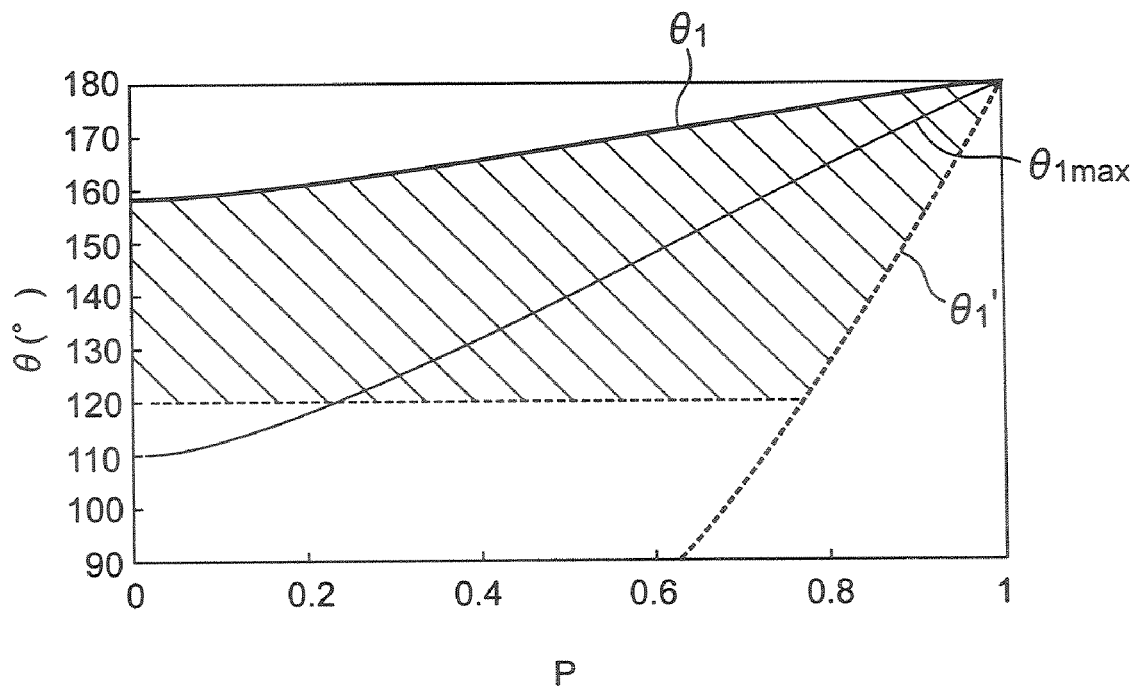
FIG. 6 is a diagram for explaining an angle formed by a magnetization direction in a magnetic recording layer with a magnetization direction in a magnetization pinned layer, in the first embodiment.

On the other hand, the angle θ is desired to be an angle that makes the spin injection efficiency high in order to implement magnetization inversion generated by spin injection at a low current density. Therefore, it is desirable that the spin injection efficiency is at least half as compared with a maximum value of the spin injection efficiency. Denoting an angle θ maximizing the spin injection efficiency by $\theta_{1max}$ and angles that make the spin injection efficiency equal to half of the maximum value of the spin injection efficiency by $\theta_1$ and $\theta_1'$ ($<\theta_1$), relations among them have dependence shown in FIG. 6 upon the spin polarization factor P of the magnetic recording layer 6. The angles $\theta_1$ and $\theta_1'$ can be represented by the following equations with respect to the spin polarization factor P of the magnetic recording layer 6.

$$\theta_1=\arccos\left[\{-\alpha\beta-2\times3^{1/2}(\beta^2-\alpha^2)\}/(4\beta^2-3\alpha^2)\right]$$

$$\theta_1'=\arccos\left[\{-\alpha\beta+2\times3^{1/2}(\beta^2-\alpha^2)\}/(4\beta^2-3\alpha^2)\right]$$

Here, the relation $0°<\theta_1'<\theta_1<180°$ is satisfied. It is appreciated from these equations that the spin injection efficiency is high when the angle θ formed by the magnetization direction in the magnetization pinned layer 4 with the magnetization direction in the magnetic recording layer 6 lies between $\theta_1'$ and $\theta_1$. By the way, since $0<P<1$, it follows that $120°<\theta_1<180°$.

If magnetization inversion is caused by spin injection, the angle θ formed by the magnetization direction in the magnetization pinned layer 4 with the magnetization direction in the magnetic recording layer 6 changes from θ to an angle near (180°−θ). If magnetization inversion is further caused, then the angle changes from an angle near (180°−θ) to an angle near θ. Therefore, it is desirable that the angle formed by the magnetization direction in the magnetization pinned layer 4 with the magnetization direction in the magnetic recording layer 6 is in the range of (180°−$\theta_1$) to (180°−$\theta_1'$) both inclusive or in the range of $\theta_1'$ to $\theta_1$ both inclusive.

On the other hand, dependence of the magnetoresistance change rate MR upon the angle formed by the magnetization direction in the magnetization pinned layer 4 with the magnetization direction in the magnetic recording layer 6 is represented by the following equation.

$$MR(\theta)=MR(0°)|\cos\theta|$$

It is appreciated from this relation that causing the angle θ to approach 90° lowers the MR. It is desirable that the magnetoresistance change rate MR is equal to at least half of the maximum value in order to read the resistance change. The magnetoresistance change rate MR decreases to half when θ=60° or θ=120°. In other words, it is desirable that θ satisfies the relation 0°<θ≦60° or 120°≦θ<180°.

From the foregoing description, it is desirable that the angle θ formed by the magnetization direction in the magnetization pinned layer 4 with the magnetization direction in the magnetic recording layer 6 is in the range of (180°−$\theta_1$) to (180°−$\theta_1'$) both inclusive or in the range of $\theta_1'$ to $\theta_1$ both inclusive, when $\theta_1'$ is at least 120°. When $\theta_1'$ is less than 120°, it is desirable that the angle θ is in the range of (180°−$\theta_1$) to 60° both inclusive or in the range of 120° to $\theta_1$ both inclusive. In the present embodiment, therefore, the value of the angle θ is taken so as to satisfy the relation in a shaded region with respect to the spin polarization factor P in the magnetic recording layer 6.

If the magnetization direction in the magnetization pinned layer 4 is made parallel or antiparallel to the magnetization direction in the magnetic recording layer 6 unlike the present embodiment, the current density at which the magnetization inversion is caused becomes high because the spin injection efficiency is low. In the present embodiment, the value of the angle θ is taken so as to lie in the shaded region shown in FIG. 6. When inverting the magnetization direction in the magnetic recording layer 6 "from a direction which is nearly antiparallel to a direction which is nearly parallel," therefore, the spin injection efficiency becomes high and consequently magnetization inversion can be implemented at a low current density.

According to the present embodiment, magnetization inversion is conducted at a low current density which does not cause element destruction and writing can be conducted at a low current, as heretofore described.

Second Embodiment

Figure 2:
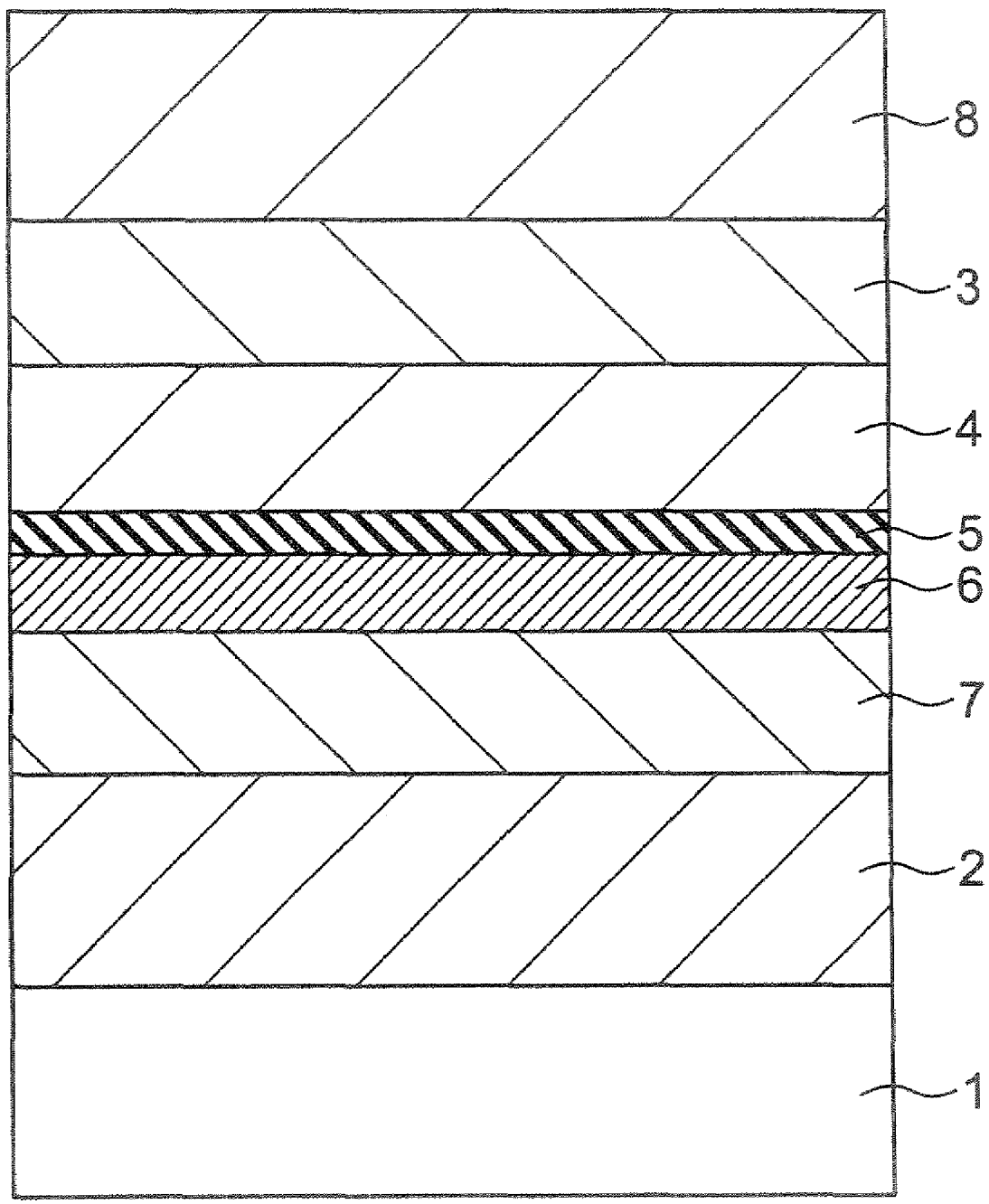
FIG. 2 is a sectional view showing a magnetoresistive effort element according to a modification of the first embodiment.

A magnetoresistance effect element according to a second embodiment of the present invention will now be described. The magnetoresistance effect element according to the present embodiment has the same layer structure as the first embodiment shown in FIG. 1 does. Its film surface takes a nearly rectangular shape in the same way as the first embodiment. By the way, the order in the layer structure may be reversed as shown in FIG. 2. Furthermore, the film surface may take a nearly elliptical shape or a nearly parallelogrammatic shape as shown in FIG. 4B or 4C, or take the shape shown in FIG. 5A, 5B or 5C.

In the magnetoresistance effect element according to the present embodiment, magnetization inversion is implemented so as to lower an average of a current density obtained when the angle θ formed by the magnetization direction in the magnetization pinned layer 4 with the magnetization direction in the magnetic recording layer 6 is inverted "from an angle which is close to the parallel state to an angle which is close to the antiparallel state" and a current density obtained when the angle θ is inverted "from the angle which is close to the antiparallel state to an angle which is close to the parallel state"

As described with reference to the first embodiment, the injection efficiency of the polarized spin electrons depends upon the angle θ formed by the magnetization direction in the magnetization pinned layer 4 with the magnetization direction in the magnetic recording layer 6 and the spin polarization factor P in the magnetic recording layer 6. The angle θ obtained when the average of the efficiency of spin injection "from an angle close to the parallel state to an angle close to the antiparallel state" and the efficiency of spin injection "from the angle close to the antiparallel state to an angle close to the parallel state" is maximized is denoted by $\theta_{2max}$. The angle $\theta$ obtained when the average becomes equal to half of the maximum value is denoted by $\theta_2$ and $\theta_2'$. The angles $\theta_{2max}$, $\theta_2$ and $\theta_2'$ have dependence shown in FIG. 7. It is now supposed that $\theta_2$ and $\theta_2'$ are angles close to the parallel state and $(180°-\theta_2)$ and $(180°-\theta_2')$ are angles close to the antiparallel state. The angles $\theta_2$ and $\theta_2'$ can be represented as regards the spin polarization factor P in the magnetic recording layer 6 by the following equations.

$$\alpha = \{(P^{1/2}+P^{-1/2})^3\}/4$$

$$\beta = -4+3\alpha,$$

$$\theta_2 = \arcsin[\{(2-3^{1/2})(\beta^2-\alpha^2)^{1/2}\}/\alpha]$$

$$\theta_2' = \arcsin[\{(2+3^{1/2})(\beta^2-\alpha^2)^{1/2}\}/\alpha]$$

Here, $0° < \theta_2 < \theta_2' < 90°$.

It is desirable that the magnetic resistance change rate MR is equal to at least half of the maximum value in order to read the resistance change. In other words, it is desirable that $\theta$ satisfies the relation $0° < \theta \leq 60°$ or $120° \leq \theta < 180°$. Since $0 < P < 1$, it follows that $0° < \theta_2 < 60°$.

When $\theta_2'$ is less than 60°, it is appreciated from these equations that the angle $\theta$ is desired to be in the range of $\theta_2$ to $\theta_2'$ both inclusive or in the range of $(180°-\theta_2')$ to $(180°-\theta_2)$ both inclusive, in order to raise the spin injection efficiency. When $\theta_2'$ is at least 60°, it is desirable that the angle $\theta$ is in the range of $\theta_2$ to 60° both inclusive or in the range of 120° to $(180°-\theta_2)$ both inclusive.

If the magnetization direction in the magnetization pinned layer 4 is made parallel or antiparallel to the magnetization direction in the magnetic recording layer 6 unlike the present embodiment, the current density at which the magnetization inversion is caused becomes high because the spin injection efficiency is low.

Figure 7:
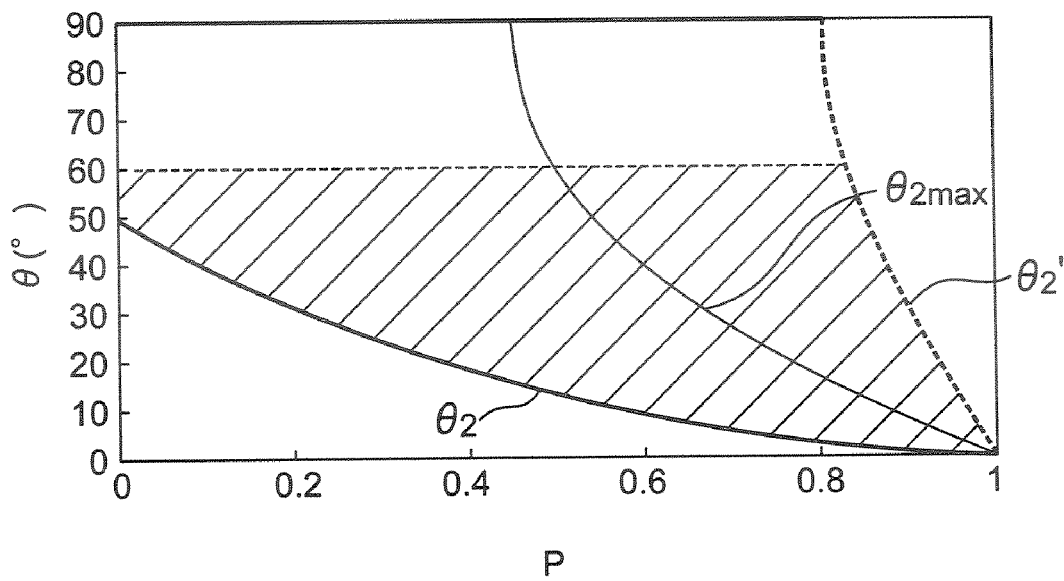
FIG. 7 is a diagram for explaining an angle formed by a magnetization direction in a magnetic recording layer with a magnetization direction in a magnetization pinned layer, in a second embodiment.

On the other hand, in the present embodiment, the angle $\theta$ is taken so as to lie in the shaded region shown in FIG. 7 with respect to the spin polarization factor P of the magnetic recording layer 6. Therefore, an average of a current density which inverts the magnetization in the magnetic recording layer 6 "from an angle close to the parallel state to an angle close to the antiparallel state" and a current density which inverts the magnetization in the magnetic recording layer 6 "from an angle close to the antiparallel state to an angle close to the parallel state" becomes low, and the magnetization inversion can be implemented at a low current density.

According to the present embodiment, magnetization inversion is conducted at a low current density which does not cause element destruction and writing can be conducted at a low current, as heretofore described.

Third Embodiment

A magnetoresistance effect element according to a third embodiment of the present invention will now be described. The magnetoresistance effect element according to the present embodiment has a layer structure and a film surface shape similar to those of the magnetoresistance effect element according to the first embodiment.

The magnetoresistance change rate MR depends upon the spin polarization factor P in the magnetic recording layer 6. For obtaining a high spin polarization factor P, it is desired to use a material having a high spin polarization factor P. As a high spin polarization factor P, P=0.8 has been obtained at a room temperature. In the present embodiment, therefore, the spin injection magnetization inversion is implemented at a low current density by using a material having a high spin polarization factor for the magnetic recording layer 6 and giving an inclination between the magnetization direction in the magnetization pinned layer 4 and the magnetization direction in the magnetic recording layer 6.

Figure 8:
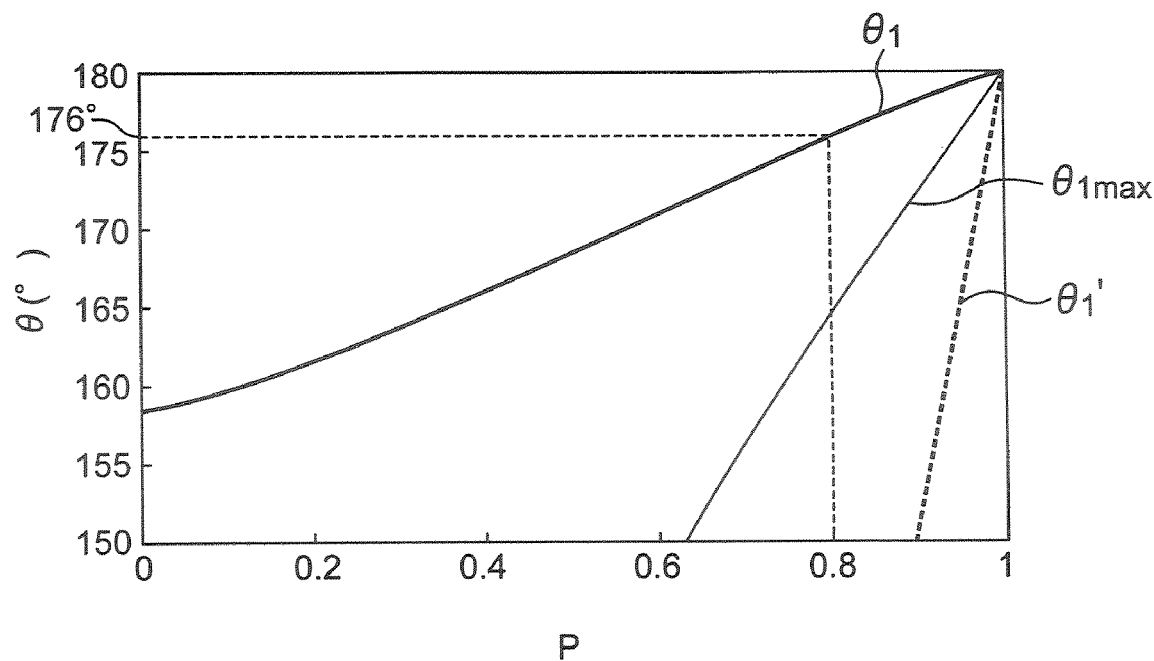
FIG. 8 is a diagram for explaining an angle formed by a magnetization direction in a magnetic recording layer with a magnetization direction in a magnetization pinned layer, in a third embodiment.

When the spin polarization factor P=0.8, the angle $\theta_1$ formed by the magnetization direction in the magnetic recording layer 6 in the magnetoresistance effect element according to the first embodiment with the magnetization pinned layer 4 becomes 176° as shown in FIG. 8. In other words, it is desirable to set the angle $\theta$ to at least 4° or at most 176° in order to make the spin injection efficiency which inverts magnetization "from an angle close to the antiparallel state to an angle close to the parallel state" equal to at least half of the maximum value.

It is desirable that the magnetic resistance change rate MR is equal to at least half of the maximum value in order to read the resistance change. In other words, it is desirable that the angle $\theta$ satisfies the relation $0° < \theta \leq 60°$ or $120° \leq \theta < 180°$.

In the present embodiment, therefore, the angle $\theta$ is set in the range of 4° to 60° both inclusive or in the range of 120° to 176° both inclusive. In the magnetoresistance effect element according to the present embodiment, the magnetization inversion can be implemented at a low current density without lowering MR very much as compared with the case where the angle $\theta$ is 0° (the parallel state) or the case where the angle $\theta$ is 180° (the antiparallel state).

According to the present embodiment, magnetization inversion is conducted at a low current density which does not cause element destruction and writing can be conducted at a low current, as heretofore described.

Fourth Embodiment

A magnetoresistance effect element according to a fourth embodiment of the present invention will now be described.

Figure 9:
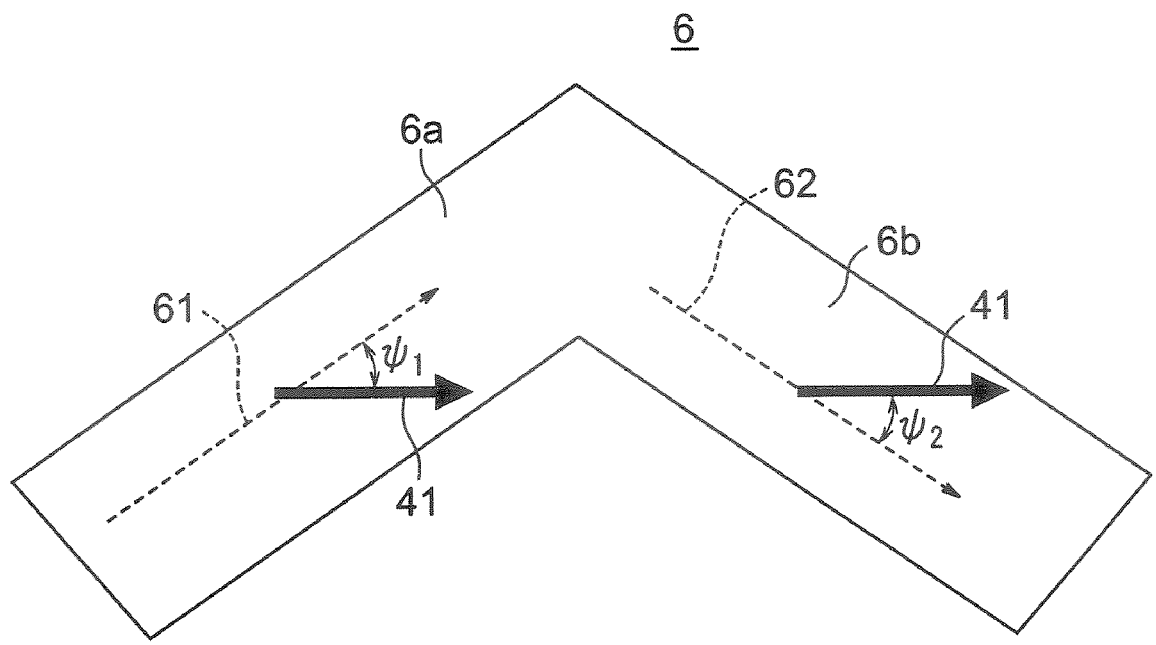
FIG. 9 is a diagram showing relations between a film surface shape of a magnetic recording layer according to a fourth embodiment and a magnetization direction in a magnetic pinned layer.

The magnetoresistance effect element according to the present embodiment is the same in layer structure as the magnetoresistance effect element according to the first embodiment shown in FIG. 1, but is different in film surface shape. A film surface shape of the magnetic recording layer 6 in the magnetoresistance effect element according to the present embodiment is shown in FIG. 9. As shown in FIG. 9, the magnetic recording layer 6 according to the present embodiment has a structure in which a major axis of a first portion 6a having a quadrangle shape and a major axis of a second portion 6b having a quadrangle shape are connected so as to cross each other at an angle greater than 0° and less than 180°. By the way, layers other than the magnetic recording layer 6, such as the lower electrode 2, the antiferromagnetic layer 3, the magnetization pinned layer 4, the tunnel barrier layer 5, the spin reflection layer 7 and the counter electrode 8, also have the film surface shape as the magnetic recording layer 6 shown in FIG. 9 does.

In general, the magnetization direction in the magnetic recording layer 6 becomes nearly parallel to the major axis because of shape anisotropy. Therefore, each of a magnetization direction 61 in the first portion 6a and a magnetization direction 62 in the second portion 6b has an inclination as compared with a magnetization direction 41 in the magnetization pinned layer 4. In other words, the magnetization direction 61 in the first portion 6a is inclined at a positive angle to the magnetization direction 41 in the magnetization pinned layer 4, and the magnetization direction 62 in the second portion 6b is inclined at a negative angle to the magnetization direction 41 in the magnetization pinned layer 4. In the present specification, a counterclockwise angle shown in FIG. 9 is regarded as a positive angle and a clockwise angle is regarded as a negative angle. As shown in FIG. 9, an angle formed by the magnetization direction 61 in the first portion 6a in the magnetic recording layer 6 with the magnetization direction 41 in the magnetization pinned layer 4 is denoted by $\Psi_1$, and an angle formed by the magnetization direction 62 in the second portion 6b in the magnetic recording layer 6 with the magnetization direction 41 in the magnetization pinned layer 4 is denoted by $\Psi_2$.

In the present embodiment, magnetization inversion at a low current density is implemented by setting both $|\Psi_1|$ and $|\Psi_2|$ approximately equal to $\theta_{2max}$ or $(180°-\theta_{2max})$ in the second embodiment and thereby raising the spin injection efficiency.

By the way, both $|\Psi_1|$ and $|\Psi_2|$ may be set to a value in the range of $(180°-\theta_1)$ to 60° both inclusive in the first embodiment, or a value in the range of 120° to $\theta_1$ both inclusive (when $\theta_1'<120°$). Or both $|\Psi_1|$ and $|\Psi_2|$ may be set to a value in the range of $(180°-\theta_1)$ to $(180°-\theta_1')$ both inclusive in the first embodiment, or a value in the range of $\theta_1'$ to $\theta_1$ both inclusive (when $\theta_1'\leqq120°$). Both $|\Psi_1|$ and $|\Psi_2|$ may be set to a value in the range of $\theta_2$ to 60° both inclusive in the second embodiment, or a value in the range of 120° to $(180°-\theta_2)$ both inclusive (when $\theta_2'\geqq60°$). Or both $|\Psi_1|$ and $|\Psi_2|$ may be set to a value in the range of $\theta_2$ to $\theta_2'$ in the second embodiment, or a value in the range of $(180°-\theta_2')$ to $(180°-\theta_2)$ both inclusive (when $\theta_2'\geqq60°$). Both $|\Psi_1|$ and $|\Psi_2|$ may be set to a value in the range of 4° to 60° both inclusive in the third embodiment, or a value in the range of 120° to 176° both inclusive.

According to the present embodiment, spin inversion is conducted at a low current density which does not cause element destruction and writing can be conducted at a low current, as heretofore described.

Fifth Embodiment

A magnetoresistance effect element according to a fifth embodiment of the present invention will now be described.

The magnetoresistance effect element according to the present embodiment is the same in layer structure as the magnetoresistance effect element according to the first embodiment shown in FIG. 1, but is different in film surface shape. By the way, the layer structure may be reversed in the order in the layer structure in the same way as the modification of the first embodiment shown in FIG. 2. The film surface of the magnetoresistance effect element according to the present embodiment takes a nearly circular shape. By the way, the film surface may take a nearly square shape or a nearly regular polygon shape having at least five angles instead of taking the nearly circular shape. In the present embodiment, the magnetization pinned layer 6 and the magnetic recording layer 4 are provided with magnetic anisotropy by utilizing induced magnetic anisotropy. The "induced magnetic anisotropy" means a phenomenon which can provide a magnetic substance with magnetic anisotropy by applying a magnetic field in a direction to be provided with magnetic anisotropy when the magnetic substance is formed or atoms can move at a high temperature. The magnetic anisotropy provided by this phenomenon is referred to as induced magnetic anisotropy.

In the present embodiment, the magnetization pinned layer 6 and the magnetic recording layer 4 are provided with the induced magnetic anisotropy, and the direction of the induced magnetic anisotropy in the magnetization pinned layer 6 is inclined at an angle $\phi$ to the direction of the induced magnetic anisotropy in the magnetic recording layer 4. Since the magnetization direction in the magnetization pinned layer 6 and the magnetization direction in the magnetic recording layer 4 nearly coincide respectively with the directions of the induced magnetic anisotropy in them, the magnetization direction in the magnetization pinned layer 6 has an inclination near the angle $\phi$ as compared with the magnetization direction in the magnetic recording layer 4. Since in the present embodiment the angle $\phi$ is set to approximately $\theta_{2max}$ in the second embodiment, the spin injection efficiency is high and magnetization inversion can be conducted at a low inverted current density.

In the present embodiment, the angle $\phi$ is set to approximately $\theta_{2max}$. Alternatively, the angle $\phi$ may be set to a value in the range of $(180°-\theta_1)$ to 60° both inclusive in the first embodiment, or a value in the range of 120° to $\theta_1$ both inclusive (when $\theta_1>120°$). Or the angle $\phi$ may be set to a value in the range of $\theta_2$ to 60° both inclusive in the second embodiment, or a value in the range of 120° to $(180°-\theta_2)$ both inclusive (when $\theta_2<60°$). The angle $\phi$ may be set to a value in the range of 4° to 60° both inclusive in the third embodiment or a value in the range of 120° to 176° both inclusive.

In the embodiments heretofore described, the magnetic film of the magnetoresistance effect element (the magnetic film constituting the magnetization pinned layer 4 and the magnetic recording layer 6) may be formed of at least one kind of a thin film or a laminated film formed using a material or materials selected from a group including a Ni—Fe alloy, a Co—Fe alloy, a Co—Fe—Ni alloy, an amorphous material such as (Co, Fe, Ni)—(Si, B), (Co, Fe, Ni)—(Si, B)—(P, Al, Mo, Nb, Mn), and a Co—(Zr, Hf, Nb, Ta, Ti), and a Heusler alloy such as $CO_2(Cr_xFe_{1-x})Al$, $CO_2MnSi$ and $CO_2MnAl$. By the way, for example, characters (Co, Fe, Ni) mean that at least one element is selected from among Co, Fe and Ni.

In particular, when a ferromagnetic layer included in the magnetic recording layer 6 or the magnetization pinned layer 4 has a laminated structure obtained by laminating a plurality of layers via non-magnetic layers, it is more desirable to use Co—Fe, Co—Fe—Ni, or Fe rich Ni—Fe having a large resistance change rate due to the magnetoresistance effect in a ferromagnetic layer located near the tunnel barrier layer 5 and use Ni rich Ni—Fe, Ni rich Ni—Fe—Co or the like in a ferromagnetic layer that is not in contact with the tunnel barrier layer, because the write current can be reduced while keeping the resistance change rate at a large value.

As the magnetic recording layer, a two-layer structure represented as a soft magnetic layer/ferromagnetic layer or a three-layer structure represented as a ferromagnetic layer/a soft magnetic layer/a ferromagnetic layer may also be used. A favorable effect is obtained by controlling the intensity of exchange interaction between ferromagnetic layers using a three-layer structure represented as a ferromagnetic layer/a non-magnetic layer/a ferromagnetic layer or a five-layer structure represented as a ferromagnetic layer/a non-magnetic layer/a ferromagnetic layer/a non-magnetic layer/a ferromagnetic layer. That is, it is not necessary to increase the write current for spin injection even if the cell width of the magnetic recording layer which is the memory cell is sub-micron or less.

It is possible to adjust not only magnetic characteristics but also adjust various physical properties such as the crystal property, mechanical characteristics, and chemical characteristics by adding non-magnetic elements such as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) to the magnetic material of the magnetization pinned layer 4 and the magnetic recording layer 6.

The magnetization pinned layer 4 and the magnetic recording layer 6 may also have a structure represented as magnetic substance/non-magnetic substance/magnetic substance coupled by exchange coupling between magnetic layers. The magnetization pinned layer 4 and the magnetic recording layer 6 may also have a structure using magnetic substances of three or more layers with exchange coupling.

On the other hand, when a tunnel junction is used as the magnetoresistance effect element, it is possible to use various insulators, such as $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (titanium oxide strontium), $LaAlO_3$ (lanthanum aluminate) and Al—N—O (aluminum oxide nitride) or HfO (hafnium oxide), as the tunnel barrier layer 5 provided between the magnetization pinned layer and the magnetic recording layer.

It is not necessary that these compounds have a completely accurate composition from the view of stoichiometry. Loss, excess, or insufficiency of oxygen, nitrogen, fluorine or the like may exist. It is desirable that the thickness of the insulation layer is thin to the extent that the tunnel current flows. As a matter of fact, it is desirable that the thickness is 10 nm or less. It is more desirable that the thickness is 2 nm or less.

Such a magnetoresistance effect element can be formed on a predetermined substrate by using ordinary thin film forming means such as various sputter methods, the evaporation method, or the molecular beam epitaxy method. As the substrate in this case, various substrates such as Si (silicon), $SiO_2$ (silicon oxide), $Al_2O_3$ (aluminum oxide), spinel and AlN (aluminum nitride) substrates can be used.

Furthermore, a layer formed of Ta (tantalum), Ti (titanium), Pt (platinum), Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum)-Cu (copper), Ru (ruthenium), Ir (iridium), Os (osmium) or Rh (rhodium) may be provided on the substrate as the underlying layer, protection layer, hard mask or the like.

It is desirable to add the antiferromagnetic film 3 to the ferromagnetic layer used as the magnetization pinned layer 4 to pin the magnetization.

As the antiferromagnetic layer 3, Fe (iron)-Mn (manganese), Pt (platinum)-Mn (manganese), Pt (platinum)-Cr (chromium)-Mn (manganese), Ni (nickel)-Mn (manganese), Ir (iridium)-Mn (manganese), NiO (nickel oxide), $Fe_2O_3$ (ferric oxide) or the like can be used.

The spin reflection layer 7 has a structure including cap layer/magnetic layer/antiferromagnetic layer or cap layer/magnetic layer/nonmagnetic layer/magnetic layer/antiferromagnetic layer in the order from the magnetic recording layer side. The spin reflection layer 7 reflects spin-polarized electrons and prompts the magnetization inversion in the magnetic recording layer. As a result, the current density for the spin injection magnetization inversion can be lowered. As for the cap layer, a protection film formed of metal, an alloy or an intermetallic compound can be used.

Hereafter, embodiments of the present invention will be described in more detail with reference to examples.

First Example

Figure 10:
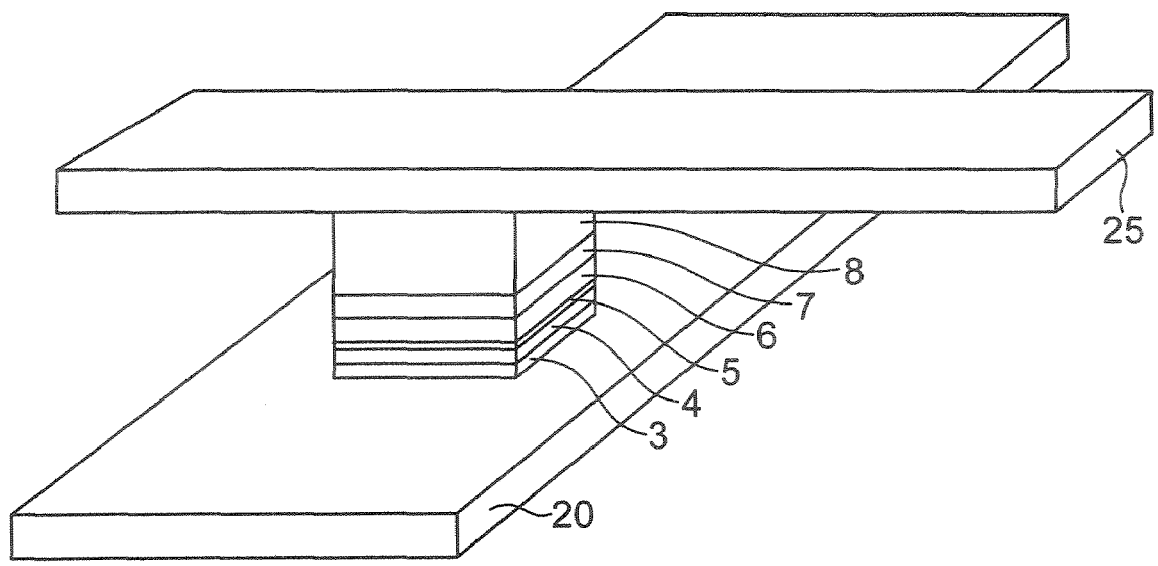
FIG. 10 is a perspective view showing a magnetoresistance effect element according to a first example.

First, a memory in a first example of the present invention will now be described with reference to FIG. 10. The magnetic memory in the present example includes lower wiring 20, upper wiring 25 and a memory cell. The memory cell includes a magnetoresistance effect element. The magnetoresistance effect element has the layer structure shown in FIG. 1. As shown in FIG. 3C, the magnetization direction in the magnetic recording layer 6 has an inclination as compared with the magnetization direction in the magnetization pinned layer 4. A magnetoresistance effect element having a film surface which takes a nearly rectangular shape as shown in FIG. 4A, a magnetoresistance effect element having a film surface which takes a nearly elliptic shape as shown in FIG. 4B, and a magnetoresistance effect element having a film surface which takes a nearly parallelogrammatic shape as shown in FIG. 4C are fabricated. By the way, the film surface shape may be a shape obtained by combining a division of a nearly rectangular shape, a division of a nearly elliptic shape, and a division of a nearly parallelogrammatic shape as shown in FIG. 5A, FIG. 5B or FIG. 5C. The magnetic memory in the present example is formed as hereafter described.

First, the lower wiring layer 20 formed of Ta (30 nm)/Al (100 nm)/Ta (50 nm) is formed on a substrate (not illustrated) formed of $SiO_2$ by sputtering. The surface of the lower wiring layer 20 is polished by using chemical mechanical polishing (CMP). Then, an underlying layer (not illustrated) formed of Ta (5 nm)/Ru (3 nm), an antiferromagnetic layer 3 formed of PtMn having a layer thickness of 15 nm, a magnetization pinned layer 4 formed of CoFe (5 nm)/Ru (1 nm)/CoFeB (3 nm), a tunnel barrier layer 5 formed of MgO having a layer thickness of 1.0 nm, a magnetic recording layer 6 formed of CoFeB having a layer thickness of 3 nm, a first cap layer formed of Ru having a layer thickness of 5 nm (not illustrated), a spin reflection layer 7 formed of CoFe (3 nm)/PtMn (15 nm), and a second cap layer formed of Ru having a layer thickness of 5 nm (not illustrated) are formed over the lower wiring layer 20 one after another. Thereafter, a counter electrode layer 8 formed of Ta (50 nm)/Al (2 nm)/Ta (150 nm) is formed on the second cap layer. Thereafter, annealing is conducted at 300° C. while applying a magnetic field in the direction of the magnetization in the magnetization pinned layer 4 in order to fix the magnetization in the magnetization pinned layer 4.

Then, resist is applied onto the counter electrode layer 8, and a resist pattern having the film surface shape of the magnetoresistance effect element is formed by using the photolithography method. By the way, the film surface of the magnetoresistance effect element takes a nearly rectangular shape, a nearly elliptic shape, or a nearly parallelogrammatic shape in order to provide the magnetization in the magnetic recording layer 6 with the shape anisotropy. The direction of the major axis in the above-described shape is inclined 32° as compared with the magnetization direction in the magnetization pinned layer 4 pinned in magnetization direction.

The counter electrode layer 8 is etched by using the resist pattern as a mask and using the reactive ion etching to form the counter electrode 8. Subsequently, the resist pattern is peeled off. Thereafter, the second cap layer, the spin reflection layer 7, the first cap layer, the magnetic recording layer 6, the tunnel barrier layer 5, the magnetization pinned layer 4 and the antiferromagnetic layer 3 by using the counter electrode layer 8 as a mask and using ion milling. Over them, a $SiO_2$ film (not illustrated) serving as a protection film is formed by sputtering.

Subsequently, a resist pattern for the lower wiring layer is formed. The lower wiring 20 is fabricated by conducting etching using the ion milling. After the resist pattern is peeled off, am interlayer insulation layer (not illustrated) formed of $SiO_2$ having a thickness of 200 nm is formed by sputtering. A resist pattern including a via-hole pattern for attaining contact with the counter electrode 8 is formed. The interlayer insulation layer is etched by using the resist pattern as a mask and using the reactive ion etching until the counter electrode 8 appears. Thereafter, the resist pattern is peeled off. Subsequently, a Ti/Al/Ti layer serving as the upper wiring layer is formed. A resist pattern is formed on the Ti/Al/Ti layer. Subsequently, the Ti/Al/Ti layer is etched by using the resist pattern as a mask and using the reactive ion etching to form the upper wiring 25. Then the resist pattern is peeled off.

Figure 11:
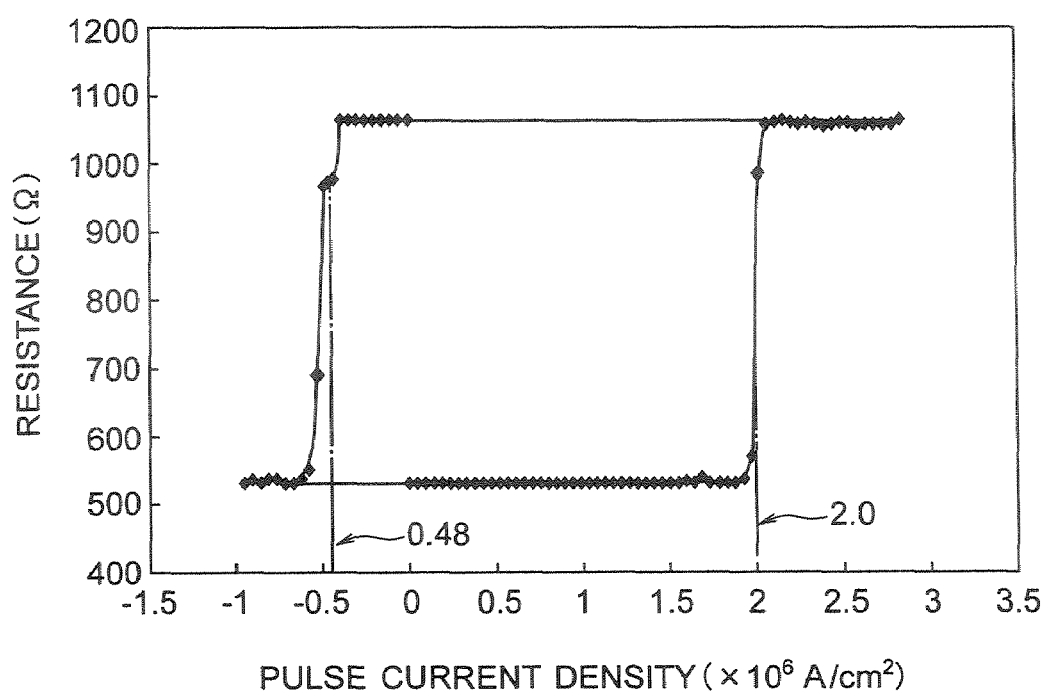
FIG. 11 is a diagram showing dependence of resistance of a magnetoresistance effect element according to the first example upon a pulse current density.

In the present example, a resistance change caused by spin injection magnetization inversion is measured by using the pulse measurement method of letting a pulse current flow through the magnetoresistance effect element and measuring the resistance at a sufficiently low current. Dependence of resistance of the magnetoresistance effect element taking a nearly rectangular shape according to the present example upon the pulse current density is shown in FIG. 11. Magnetization inversion is caused by spin injection, and the resistance change can be observed. The current density for the magnetization inversion is estimated at $0.48 \times 10^6$ A/cm$^2$ when the magnetization direction in the magnetic recording layer 6 is inverted from a direction close to the antiparallel state to a direction close to the parallel state as compared with the magnetization direction in the magnetization pinned layer 4. The current density for the magnetization inversion is estimated at $2.0 \times 10^6$ A/cm$^2$ when the magnetization direction in the magnetic recording layer 6 is inverted from a direction close to the parallel state to a direction close to the antiparallel state. The current density at which the magnetization inversion is caused is $1.2 \times 10^6$ A/cm$^2$ on the average.

As a comparative example, a sample that is the same as that in the present example except the magnetization direction in the magnetic recording layer is not inclined as compared with the magnetization direction in the magnetization pinned layer, i.e., the inclination angle is 0° or 180° is produced, and the magnetization is inverted by spin injection. The current density at which the magnetization inversion is caused in the comparative example is $1.0 \times 10^7$ A/cm$^2$ on the average for the case of inversion from the nearly antiparallel state to the nearly parallel state and the case of inversion from the nearly parallel state to the nearly antiparallel state.

In the present example, therefore, spin injection writing can be conducted at a low current density.

Figures 12, 13:
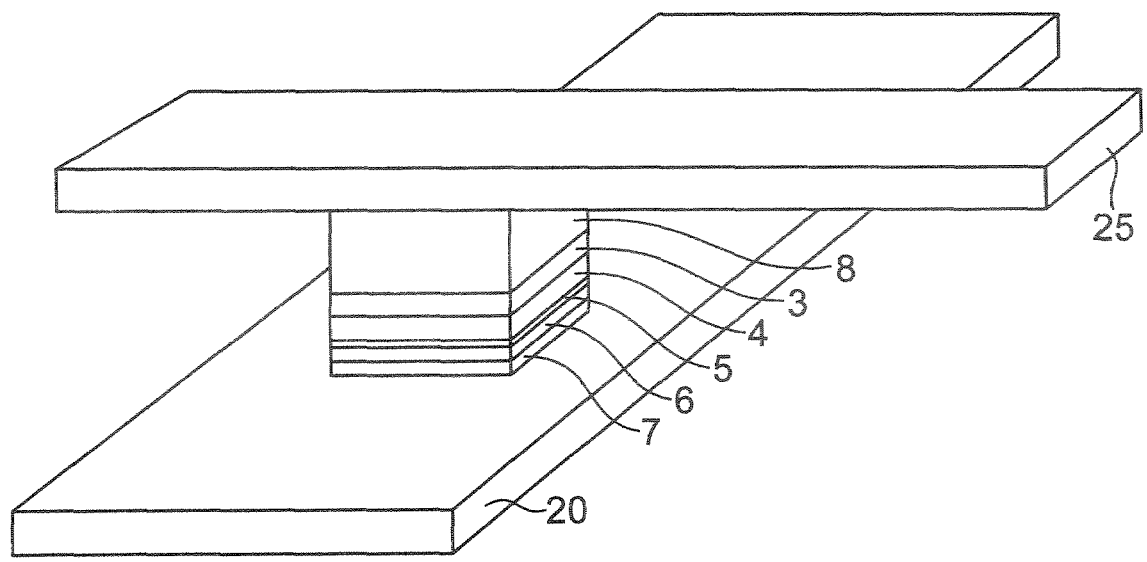
FIG. 12 is a diagram showing a film surface shape, a film surface area, and an average inverted current density of a magnetoresistance effect element according to the first example.
FIG. 13 is a perspective view showing a magnetoresistance effect element according to a second example.

An area and an average inversion current density of a magnetoresistance effect element that is nearly elliptic or nearly parallelogrammatic in film surface shape are shown in FIG. 12. In the magnetoresistance effect element that is nearly elliptic or nearly parallelogrammatic in film surface shape as well, spin injection writing can be conducted at a low current density.

The magnetic memory in the present example has been proved to allow spin injection writing at a low current and proved to be suitable as a large capacity memory.

Second Example

A magnetic memory according to a second example will now be described with reference to FIG. 13. The magnetic memory in the present example includes lower wiring 20, upper wiring 25 and a memory cell. The memory cell includes a magnetoresistance effect element. In this magnetoresistance effect element, the magnetization direction in the magnetic recording layer 6 has an inclination as compared with the magnetization direction in the magnetization pinned layer 4 as shown in FIG. 3C. A magnetoresistance effect element having a film surface which takes a nearly rectangular shape as shown in FIG. 4A, a magnetoresistance effect element having a film surface which takes a nearly elliptic shape as shown in FIG. 4B, and a magnetoresistance effect element having a film surface which takes a nearly parallelogrammatic shape as shown in FIG. 4C are fabricated. By the way, the film surface shape may be a shape obtained by combining a division of a nearly rectangular shape, a division of a nearly elliptic shape, and a division of a nearly parallelogrammatic shape as shown in FIG. 5A, FIG. 5B or FIG. 5C. In the present example, the layer structure between the lower wiring and the counter electrode has an order obtained by reversing that in the first example. The magnetic memory in the present example is formed as hereafter described.

Up to the lower wiring 20 is fabricated in the same process as that in the first example. The surface of the lower wiring 20 is polished by using chemical mechanical polishing (CMP). Then, an underlying layer (not illustrated) formed of Ta (5 nm)/Ru (3 nm), a spin reflection layer 7 formed of PtMn (15 nm)/CoFe (3 nm), a first cap layer formed of Ru having a layer thickness of 5 nm (not illustrated), a magnetic recording layer 6 formed of CoFeB having a layer thickness of 3 nm, a tunnel barrier layer 5 formed of MgO having a layer thickness of 1.0 nm, a magnetization pinned layer 4 formed of CoFe (5 nm)/Ru (1 nm)/CoFeB (3 nm), an antiferromagnetic layer 3 formed of PtMn having a layer thickness of 15 nm, and a second cap layer formed of Ru having a layer thickness of 5 nm (not illustrated) are formed over the lower wiring 20 in the cited order. Thereafter, a counter electrode layer 8 formed of Ta (50 nm)/Al (2 nm)/Ta (150 nm) is formed on the second cap layer.

Thereafter, annealing is conducted at 300° C. while applying a magnetic field in the direction of the magnetization in the magnetization pinned layer 4 in order to fix the magnetization in the magnetization pinned layer 4.

In the present example, resist is applied onto the counter electrode layer 8, and a resist pattern having the film surface shape of the magnetoresistance effect element is formed by using the photolithography method. By the way, the film surface of the magnetoresistance effect element takes a nearly rectangular shape, a nearly elliptic shape, or a nearly parallelogrammatic shape in order to provide the magnetization in the magnetic recording layer 6 with the shape anisotropy. The direction of a longer side or the direction of the major axis in the above-described film surface shape is inclined by 38° as compared with the magnetization direction in the magnetization pinned layer 4 pinned in magnetization direction.

A subsequent working process of the magnetoresistance effect element is the same as that in the first example. A magnetic memory can thus be formed. In the present example, a resistance change caused by spin injection magnetization inversion is measured by using the pulse measurement method.

Figures 14, 15:
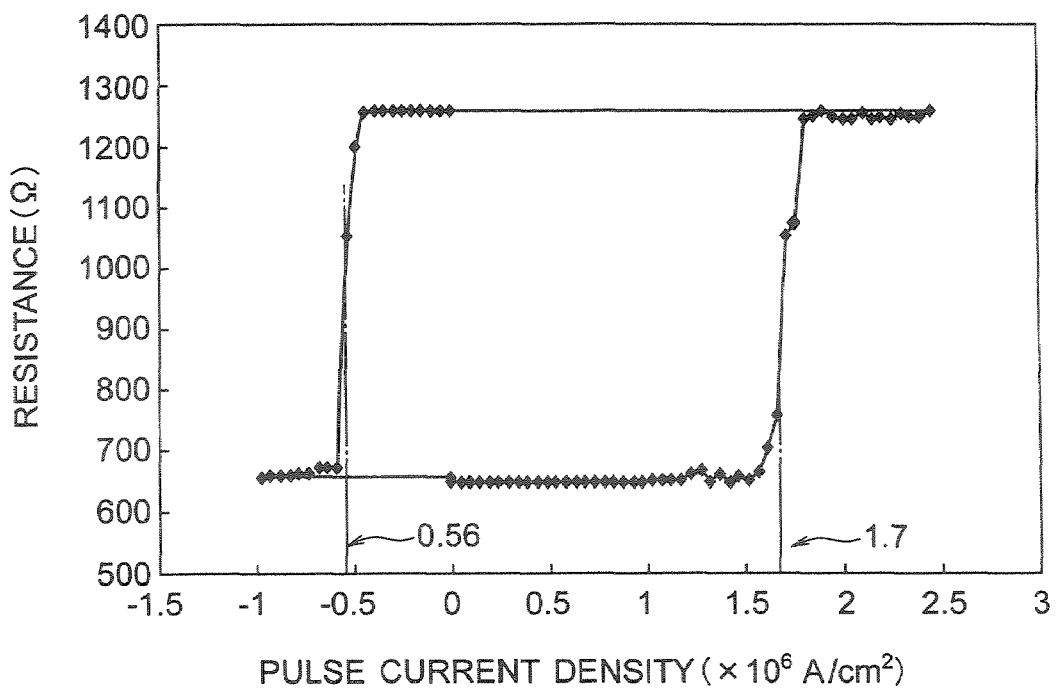
FIG. 14 is a diagram showing dependence of resistance of a magnetoresistance effect element according to the second example upon a pulse current density.
FIG. 15 is a diagram showing a film surface shape, a film surface area, and an average inverted current density of a magnetoresistance effect element according to the second example.

In the present example, spin injection magnetization inversion is caused and a resistance change can be measured. Dependence of resistance of the magnetoresistance effect element having a film surface which takes a nearly elliptic shape upon the pulse current density is shown in FIG. 14. The current density for the magnetization inversion in the magnetoresistance effect element having a film surface which takes a nearly elliptic shape is estimated at $0.56 \times 10^6$ A/cm$^2$ when the magnetization direction in the magnetic recording layer 6 is inverted from a direction close to the antiparallel state to a direction close to the parallel state as compared with the magnetization direction in the magnetization pinned layer 4. The current density for the magnetization inversion is estimated at $1.7 \times 10^6$ A/cm$^2$ when the magnetization direction in the magnetic recording layer 6 is inverted from a direction close to the parallel state to a direction close to the antiparallel state. The current density at which the magnetization inversion is caused is $1.1 \times 10^6$ A/cm² on the average.

As a comparative example, a sample that is the same as that in the present example except the magnetization direction in the magnetic recording layer is not inclined as compared with the magnetization direction in the magnetization pinned layer, i.e., the inclination angle is 0° or 180° is produced, and the magnetization is inverted by spin injection. The current density at which the magnetization inversion is caused in the comparative example is $1.0 \times 10^7$ A/cm² on the average for the case of inversion from the nearly antiparallel state to the nearly parallel state and the case of inversion from the nearly parallel state to the nearly antiparallel state.

In the present example, therefore, spin injection writing can be conducted at a low current density.

An area and an average inversion current density of a magnetoresistance effect element that is nearly elliptic or nearly parallelogrammatic in film surface shape are shown in FIG. 15. It is appreciated from FIG. 15 that spin injection writing can be conducted at a low current density in the magnetoresistance effect element that is nearly elliptic or nearly parallelogrammatic in film surface shape as well.

The magnetic memory in the present example has been proved to allow spin injection writing at a low current and proved to be suitable as a large capacity memory.

Third Example

As a third example of the present invention, a magnetoresistance effect element which takes a shape having two axes in shape anisotropy is fabricated. In the present example, the same layer structure as that of the magnetoresistive according to the first example is formed. Annealing is conducted at 300° C. while appealing a magnetic field in the magnetization direction in the magnetization pinned layer.

Figure 16A:
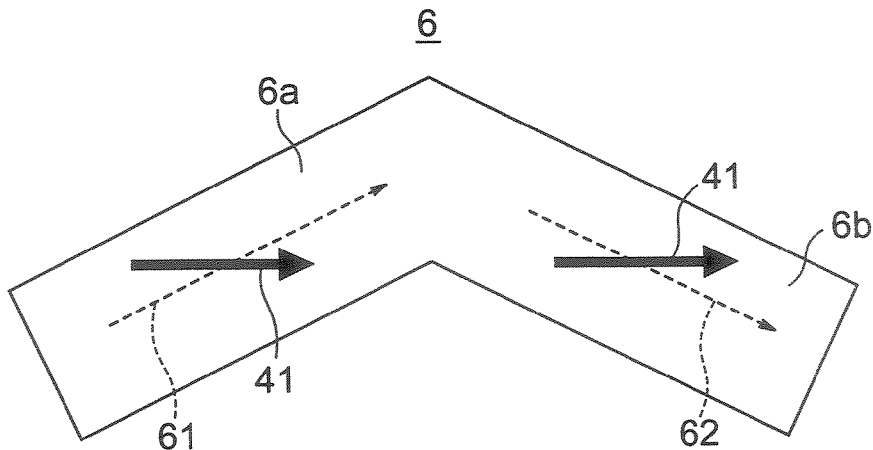
FIGS. 16A to 16C are diagrams showing film surface shapes of a magnetic recording layer in a magnetoresistance effect element according to a third example.
Figure 16B:
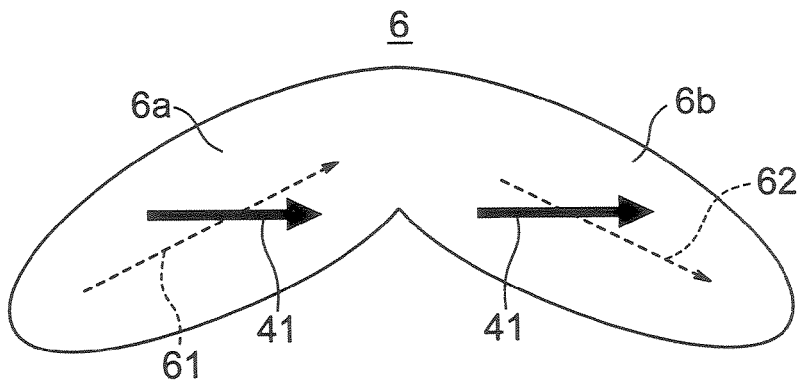
Figure 16C:
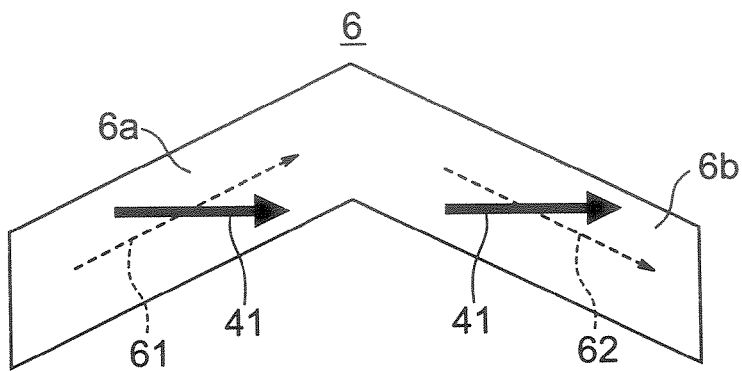

In the present example, a magnetoresistance effect element having a film surface shape obtained by combining two nearly rectangular shapes as shown in FIG. 16A, a magnetoresistance effect element having a film surface shape obtained by combining two nearly elliptic shapes as shown in FIG. 16B, and a magnetoresistance effect element having a film surface shape obtained by combining two nearly parallelogrammatic shapes as shown in FIG. 16C are worked by using the same photolithography method as that in the first example. The film surface of the element may take a shape obtained by combining two from among a nearly rectangular shape, a nearly elliptic shape and a nearly parallelogrammatic shape. The film surface of the element may take a shape obtained by combining a division of a nearly rectangular shape, a division of a nearly elliptic shape, and a division of a nearly parallelogrammatic shape.

The angle $\Psi_1$ formed by the axis 61 of the shape anisotropy in the first portion of the magnetic recording layer 6 with the magnetization direction 41 in the magnetization pinned layer 4 is set to 32°, and the angle $\Psi_2$ formed by the axis 62 of the shape anisotropy in the second portion of the magnetic recording layer 6 with the magnetization direction 41 in the magnetization pinned layer 4 is set to −32° (see FIG. 9). Thereafter, magnetoresistance effect elements are fabricated in the same process as that in the first example.

As regards the magnetoresistance effect elements according to the present example thus formed, a resistance change caused by spin injection magnetization inversion is measured by using the pulse measurement method. The shape, area, and measured spin injection magnetization inversion current density of the fabricated magnetoresistance effect elements are shown in FIG. 17.

As a comparative example, a sample that is the same as that in the present example except the magnetization direction in the magnetic recording layer is not inclined as compared with the magnetization direction in the magnetization pinned layer, i.e., the inclination angle is 0° or 180° is produced, and the magnetization is inverted by spin injection. The current density at which the magnetization inversion is caused in the comparative example is $1.0 \times 10^7$ A/cm² on the average for the case of inversion from the nearly antiparallel state to the nearly parallel state and the case of inversion from the nearly parallel state to the nearly antiparallel state.

In the present example, therefore, spin injection writing can be conducted at a low current density. If the magnetoresistance effect elements in the magnetic memory according to the first or second example are replaced by the magnetoresistance effect elements in the present example, a magnetic memory that can have a large capacity is obtained.

Fourth Example

As for a magnetoresistance effect element in the present example, a magnet is installed in a film forming device and film forming is conducted while applying a magnetic field to a sample. At the time of film forming, the magnetic recording layer is provided with induced magnetic anisotropy at the first time by inclining the magnetization direction in the magnetization pinned layer at an angle φ to the magnetization direction in the magnetic recording layer. As for the layer structure, the same structure as that in the magnetoresistance effect element according to the first example is used.

A sample provided with induced magnetic anisotropy at the second time by annealing after the film forming and a sample which is not provided with induced magnetic anisotropy at the second time without annealing are fabricated. As for annealing in the present example, annealing is conducted at 300° C. by applying a magnetic field in a direction which is nearly the same as the direction of the magnetic field at the time of film forming for the magnetization pinned layer, then the temperature is lowered to 120° C., and annealing is conducted by applying a magnetic field nearly in the same direction as that of the magnetic field used at the time of film forming of the magnetic recording layer.

In the present example, a magnetoresistance effect element taking the shape of a square and a magnetoresistance effect element taking the shape of a circle are fabricated. In the element working process in the present example, the same method as that in the first example is used. The spin injection magnetization inversion current density is measured by using the pulse measurement method in the same way as the first example.

The average inversion current densities for some element shapes and some angles φ are shown in FIG. 18. It is appreciated from FIG. 18 that there is little change in spin injection magnetization inversion current density as long as the element is provided with the induced magnetic anisotropy at the time of film forming, regardless of whether the element is provided with induced magnetic anisotropy at the second time.

As a comparative example, a sample that is the same as that in the present example except the magnetization direction in the magnetic recording layer is not inclined as compared with the magnetization direction in the magnetization pinned layer, i.e., the inclination angle is 0° or 180° is produced, and the magnetization is inverted by spin injection. The current density at which the magnetization inversion is caused in the comparative example is $1.0 \times 10^7$ A/cm² on the average for the case of inversion from the nearly antiparallel state to the nearly parallel state and the case of inversion from the nearly parallel state to the nearly antiparallel state.

Therefore, it is appreciated that the structure in the present example allows spin injection writing at a low current.

If the magnetoresistance effect elements in the magnetic memory according to the first or second example are replaced by the magnetoresistance effect elements in the present example, a magnetic memory that can have a large capacity is obtained.

According to the examples of the present invention, it is possible to cause spin inversion at a low current density which does not cause element destruction and writing can be conducted with a small current, as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetoresistance effect element, comprising:
a magnetization pinned layer in which a magnetization direction is pinned;
a magnetic recording layer in which a magnetization direction is changeable, the magnetization direction in the magnetization pinned layer forming an angle, which is greater than 0 degrees and less than 180 degrees, with a magnetization direction in the magnetic recording layer, and the magnetization direction in the magnetic recording layer being inverted by injecting spin-polarized electrons into the magnetic recording layer; and
a non-magnetic metal layer provided between the magnetization pinned layer and the magnetic recording layer.

2. The magnetoresistance effect element according to claim 1, wherein,
a film surface of the magnetic recording layer substantially takes a shape of a rectangle,
the magnetization direction in the magnetization pinned layer is inclined at an angle, which is greater than 0 degrees and less than 180 degrees, with respect to a major axis of the rectangle, and
the magnetization direction in the magnetic recording layer is substantially parallel to the major axis of the rectangle.

3. The magnetoresistance effect element according to claim 1, wherein,
a film surface of the magnetic recording layer substantially takes a shape of an ellipse,
the magnetization direction in the magnetization pinned layer is inclined at an angle, which is greater than 0 degrees and less than 180 degrees, with respect to a major axis of the ellipse, and
the magnetization direction in the magnetic recording layer is substantially parallel to the major axis of the ellipse.

4. The magnetoresistance effect element according to claim 1, wherein,
a film surface of the magnetic recording layer substantially takes a shape of a parallelogram,
the magnetization direction in the magnetization pinned layer is inclined at an angle, which is greater than 0 degrees and less than 180 degrees, with respect to a longer side of the parallelogram, and
the magnetization direction in the magnetic recording layer is substantially parallel to the longer side of the parallelogram.

5. The magnetoresistance effect element according to claim 1, wherein,
a film surface shape of the magnetic recording layer comprises a first portion having a first major axis and a second portion having a second major axis which crosses the first major axis at an angle greater than 0 degrees and less than 180 degrees and is connected to the first portion, and
one of the first and second major axes forms a positive angle with the magnetization direction in the magnetization pinned layer, whereas the other of the first and second major axes forms a negative angle with the magnetization direction in the magnetization pinned layer.

6. The magnetoresistance effect element according to claim 1, wherein,
the magnetic recording layer has an induced magnetic anisotropy,
the magnetization direction in the magnetic recording layer is substantially parallel to a direction of the induced magnetic anisotropy, and
the magnetization direction in the magnetization pinned layer has an inclination with an angle which is greater than 0 degrees and less than 180 degrees as compared with the direction of the induced magnetic anisotropy in the magnetic recording layer.

7. The magnetoresistance effect element according to claim 1, wherein,
denoting a spin polarization factor P of the magnetic recording layer by P, and letting $\alpha = \{(P^{1/2} + P^{-1/2})^3\}/4$, $\beta = -4 + 3\alpha$, $\theta_1 = \arccos[\{-\alpha\beta - 2\times3^{1/2}(\beta^2 - \alpha^2)\}/(4\beta^2 - 3\alpha^2)]$, and $\theta_1' = \arccos[\{-\alpha\beta + 2\times3^{1/2}(\beta^2 - \alpha^2)\}/(4\beta^2 - 3\alpha^2)]$ (where $0° < \theta_1' < \theta_1 < 180°$), when $\theta_1'$ is 120° or more, an angle $\theta$ formed by the magnetization direction in the magnetization pinned layer with the magnetization direction in the magnetic recording layer is in a range of $(180° - \theta_1)$ to $(180° - \theta_1')$, both inclusive or in a inclusive, and
when $\theta_1'$ is less than 120°, the angle $\theta$ is in a range of $(180° - \theta_1)$ to 60°, both inclusive, or in a range of 120° to $\theta_1$, both inclusive.

8. The magnetoresistance effect element according to claim 1, wherein,
denoting a spin polarization factor P of the magnetic recording layer by P, and letting $\alpha = \{(P^{1/2} + P^{-1/2})^3\}/4$, $\beta = -4 + 3\alpha$, $\theta_2 = \arcsin[\{(2 - 3^{1/2})(\beta^2 - \alpha^2)^{1/2}\}/\alpha]$, and $\theta_2' = \arcsin[\{(2 + 3^{1/2})(\beta^2 - \alpha^2)^{1/2}\}/\alpha]$ (where $0° < \theta_2 < \theta_2' < 90°$), when $\theta_2'$ is less than 60°, an angle $\theta$ formed by the magnetization direction in the magnetization pinned layer with the magnetization direction in the magnetic recording layer is in a range of $\theta_2$ to $\theta_2'$, both inclusive, or in a range of $(180° - \theta_2')$ to $(180° - \theta_2)$, both inclusive, and
when $\theta_2'$ is 60° or more, the angle $\theta$ is in a range of $\theta_2$ to 60°, both inclusive, or in a range of 120° to $(180° - \theta_2)$, both inclusive.

9. The magnetoresistance effect element according to claim 1, wherein an angle formed by the magnetization direction in the magnetization pinned layer with the magnetization direction in the magnetic recording layer is in a range of 4° to 60°, both inclusive, or in a range of 120° to 176°, both inclusive.

10. A magnetic memory, comprising:
a first wiring;
a second wiring; and
a memory cell comprising the magnetoresistance effect element according to claim 1, the magnetic recording layer in the magnetoresistance effect element being electrically connected to the first wiring, and the magnetization pinned layer in the magnetoresistance effect element being electrically connected to the second wiring.

* * * * *